United States Patent
Yuh

(10) Patent No.: US 8,520,441 B2
(45) Date of Patent: Aug. 27, 2013

(54) WORD LINE KICKING WHEN SENSING NON-VOLATILE STORAGE

(75) Inventor: Jong Hak Yuh, Pleasanton, CA (US)

(73) Assignee: SanDisk Technologies Inc., Plano, TX (US)

( * ) Notice: Subject to any disclaimer, the term of this patent is extended or adjusted under 35 U.S.C. 154(b) by 325 days.

(21) Appl. No.: 12/947,693

(22) Filed: Nov. 16, 2010

(65) Prior Publication Data
US 2012/0120729 A1  May 17, 2012

(51) Int. Cl.
*G11C 16/06* (2006.01)
(52) U.S. Cl.
USPC ............ 365/185.22; 365/185.18; 365/185.19; 365/185.25
(58) Field of Classification Search
USPC ............ 365/185.01, 185.17, 185.18, 185.19, 365/185.25, 185.33, 185.22
See application file for complete search history.

(56) References Cited

U.S. PATENT DOCUMENTS

| | | | |
|---|---|---|---|
| 6,104,665 A | 8/2000 | Hung et al. | |
| 6,134,146 A | 10/2000 | Bill et al. | |
| 6,567,310 B2 | 5/2003 | Einaga et al. | |
| 7,064,981 B2 * | 6/2006 | Roohparvar | 365/185.17 |
| 7,349,258 B2 | 3/2008 | Fong et al. | |
| 7,352,626 B1 | 4/2008 | Wu et al. | |
| 7,532,531 B2 * | 5/2009 | Lee | 365/218 |
| 2006/0239108 A1 | 10/2006 | Shimizu et al. | |
| 2007/0097759 A1 | 5/2007 | Chen | |
| 2007/0140011 A1 * | 6/2007 | Kamei | 365/185.17 |
| 2008/0117684 A1 * | 5/2008 | Hemink | 365/185.19 |
| 2009/0001950 A1 | 1/2009 | Ariki | |

OTHER PUBLICATIONS

PCT International Search Report and Written Opinion of the International Searching Authority dated Jan. 30, 2012, PCT Application No. PCT/US2011/056137 filed Oct. 13, 2011, 10 pages.

* cited by examiner

*Primary Examiner* — Pho M Luu
*Assistant Examiner* — Thao Bui
(74) *Attorney, Agent, or Firm* — Vierra Magen Marcus LLP

(57) ABSTRACT

Methods and devices for sensing non-volatile storage are disclosed. Technology disclosed herein reduces the time for sensing operations of non-volatile storage such as read and program verify. In one embodiment, a kicking voltage is applied to a selected word line during a sensing operation. The kicking voltage may be applied to one end of a selected word line during a transition from a first reference voltage to a second reference voltage. The kicking voltage may help the other end of the word line reach the second reference voltage quickly. Since the bit lines can be sensed after the selected word line has reached the target reference voltage, the time delay prior to sensing of the bit lines may be reduced.

20 Claims, 16 Drawing Sheets

WORD LINE KICKING WHEN SENSING NON-VOLATILE STORAGE

BACKGROUND

1. Field

This disclosure relates to non-volatile storage.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory may utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

One possibility is to store a single bit in a each memory cell. All memory cells in a group may be erased, and then those to receive a "1" may be programmed such that the threshold voltage is above a program verify threshold voltage. The state of a memory cell can later be determined by reading the memory cell to determine whether its threshold voltage is above or below a read reference threshold voltage. The read reference threshold voltage may be somewhat less than the program verify threshold voltage to provide a margin of error. It is also possible to store multiple bits per memory cell by programming a given memory cell to one of a number of possible threshold voltage ranges. For example, if memory cells are programmed to one of four threshold voltage ranges, then each memory cell could store two bits. Eight threshold voltage ranges might be used to store three bits per memory cell, and so on.

In some architectures there are word lines and bit lines. The word lines may be used to apply a voltage to the control gates when programming and reading memory cells. For example, during a read operation, a read reference voltage may be applied to the control gates of selected memory cells, and a read pass voltage may be applied to control gates of unselected memory cells. A bit line that is associated with a given selected memory cell may be sensed to determine how the selected memory cell responds to application of the read reference voltage. In one technique, the selected memory cell will conduct a significant current if its threshold voltage is less than the read reference voltage.

In one possible approach for reading memory cells that store multiple bits, several read reference voltages of different magnitudes are applied to the selected word line. Note that there may be a delay between the time that a read reference voltage is first applied to the selected word line and the time that the bit line may be sensed. One reason for this delay is that, for an accurate reading, the voltage on the selected word line may need to stabilize before the bit lines can be sensed. That is, all portions of the selected word line should be at the read reference voltage prior to sensing the bit lines. Because there may need to be several read reference voltages of different magnitudes to complete the read operation, such delays may impact overall sensing time. For example, in one approach seven different read reference voltages are applied to determine which of eight states a memory cell is in. In one approach, 15 different read reference voltages are applied to determine which of 16 states a memory cell is in.

DETAILED DESCRIPTION

Methods and devices for sensing non-volatile storage are disclosed. Technology disclosed herein reduces the time for sensing operations of non-volatile storage such as read and program verify. In one embodiment, a kicking voltage is applied to a selected word line during a sensing operation. The kicking voltage may be applied to one end of a selected word line during a transition from a first reference voltage to a second reference voltage. The kicking voltage may help the other end of the word line reach the second reference voltage quickly. Since the bit lines can be sensed after the selected word line has reached the target reference voltage, the time delay prior to sensing of the bit lines may be reduced.

Example Memory System and Operation

Figure 1:
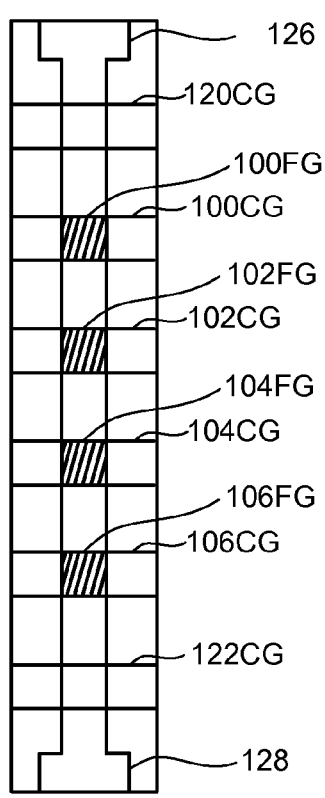
FIG. 1 is a top view of a NAND string.
Figure 2:
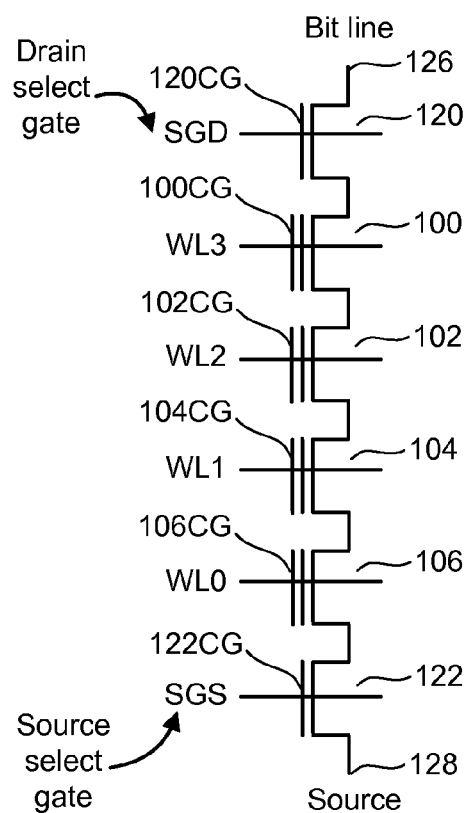
FIG. 2 is an equivalent circuit diagram of the NAND string of FIG. 1.

One example of a memory system suitable for implementing embodiments uses a NAND flash memory architecture, which includes connecting multiple transistors in series between two select gates. However, note that embodiments are not limited to the NAND architecture. The transistors connected in series and the select gates are referred to as a NAND string. FIG. 1 is a top view showing one NAND string. FIG. 2 is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 3:
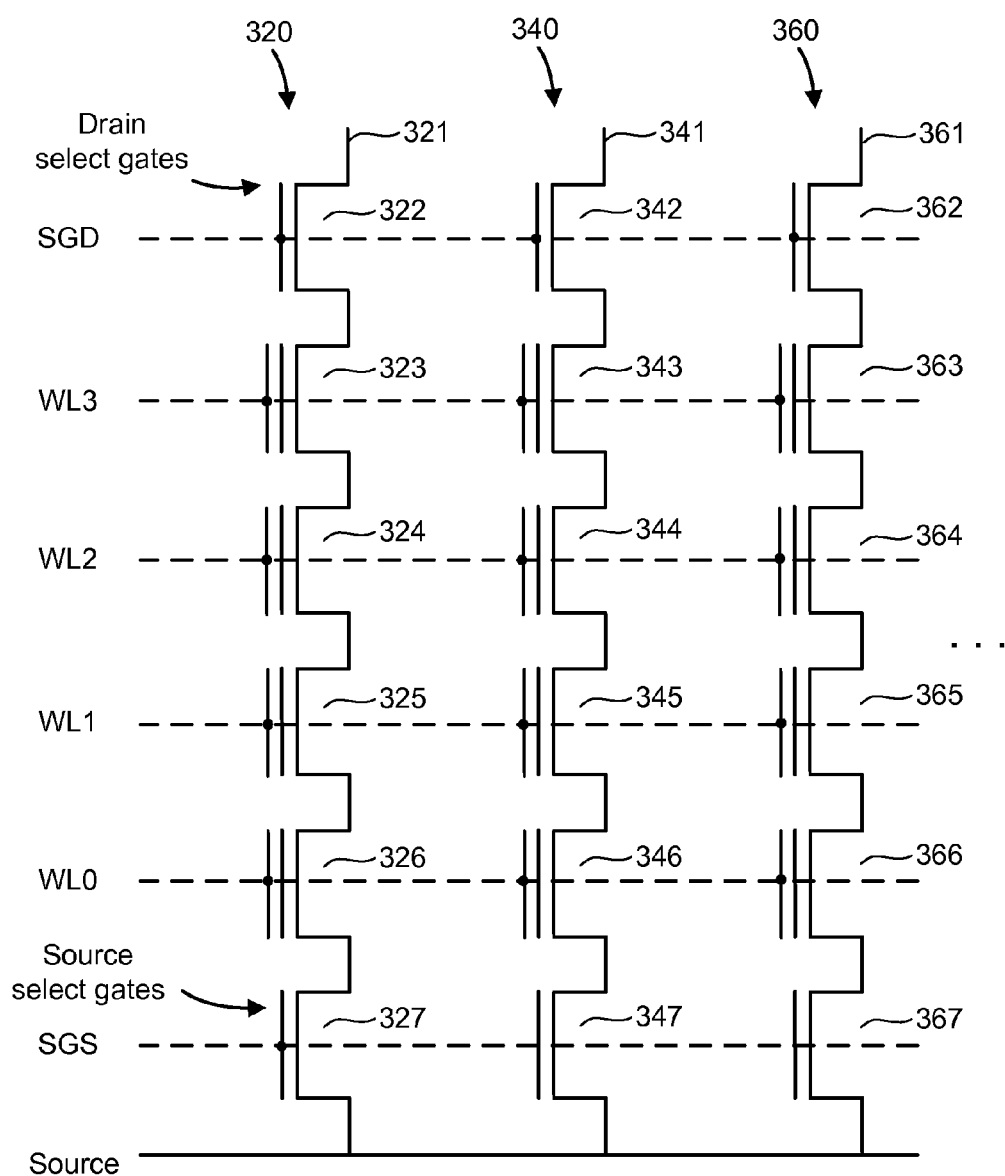
FIG. 3 is a circuit diagram depicting three NAND strings.

FIG. 3 is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, NAND strings can have thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage may be applied to the control gate of the storage element, and the bit line associated with the storage element may be grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

Figure 4:
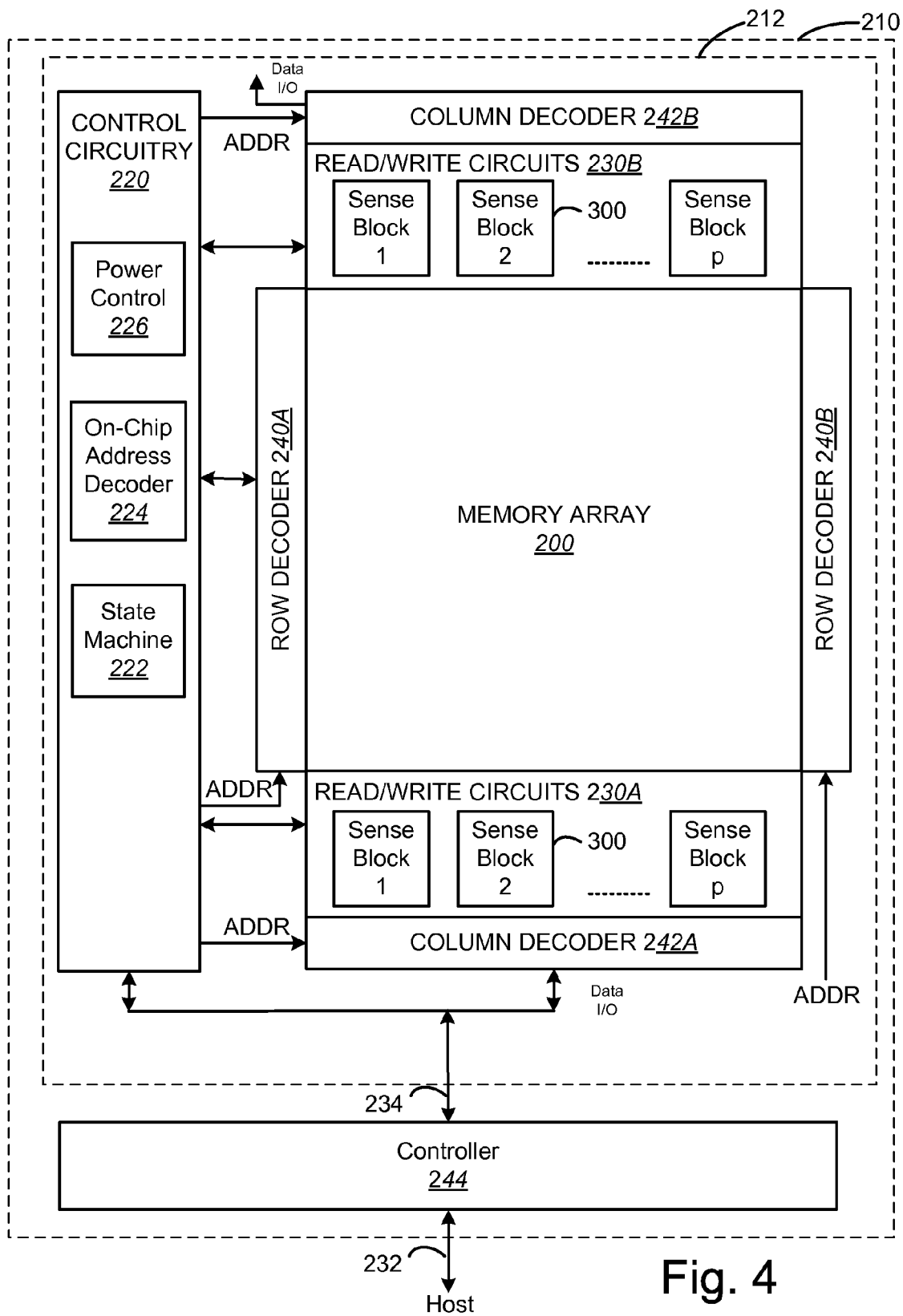
FIG. 4 illustrates a non-volatile storage device that may include one or more memory die or chips.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5:
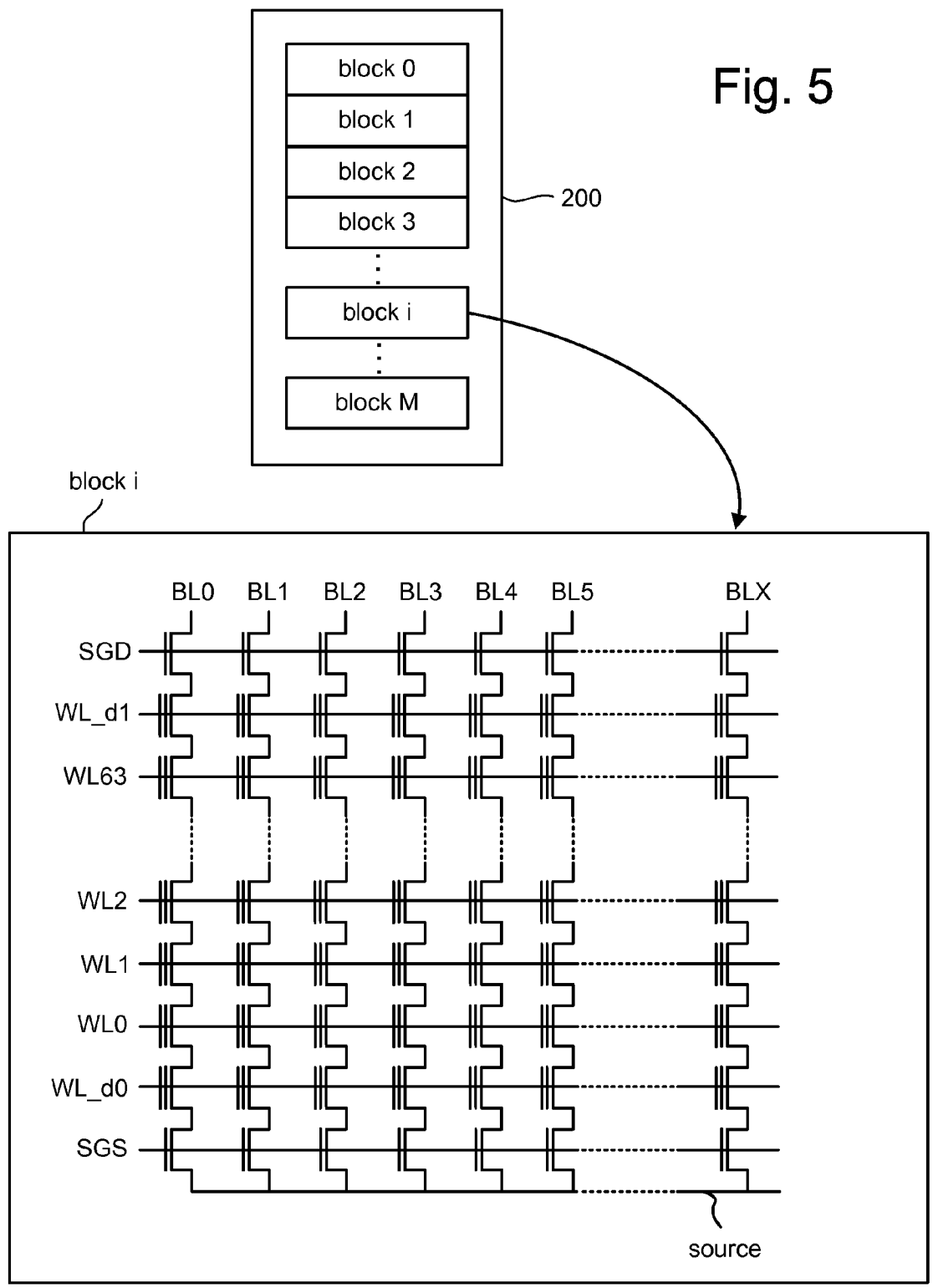
FIG. 5 depicts an exemplary structure of memory cell array.

FIG. 5 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
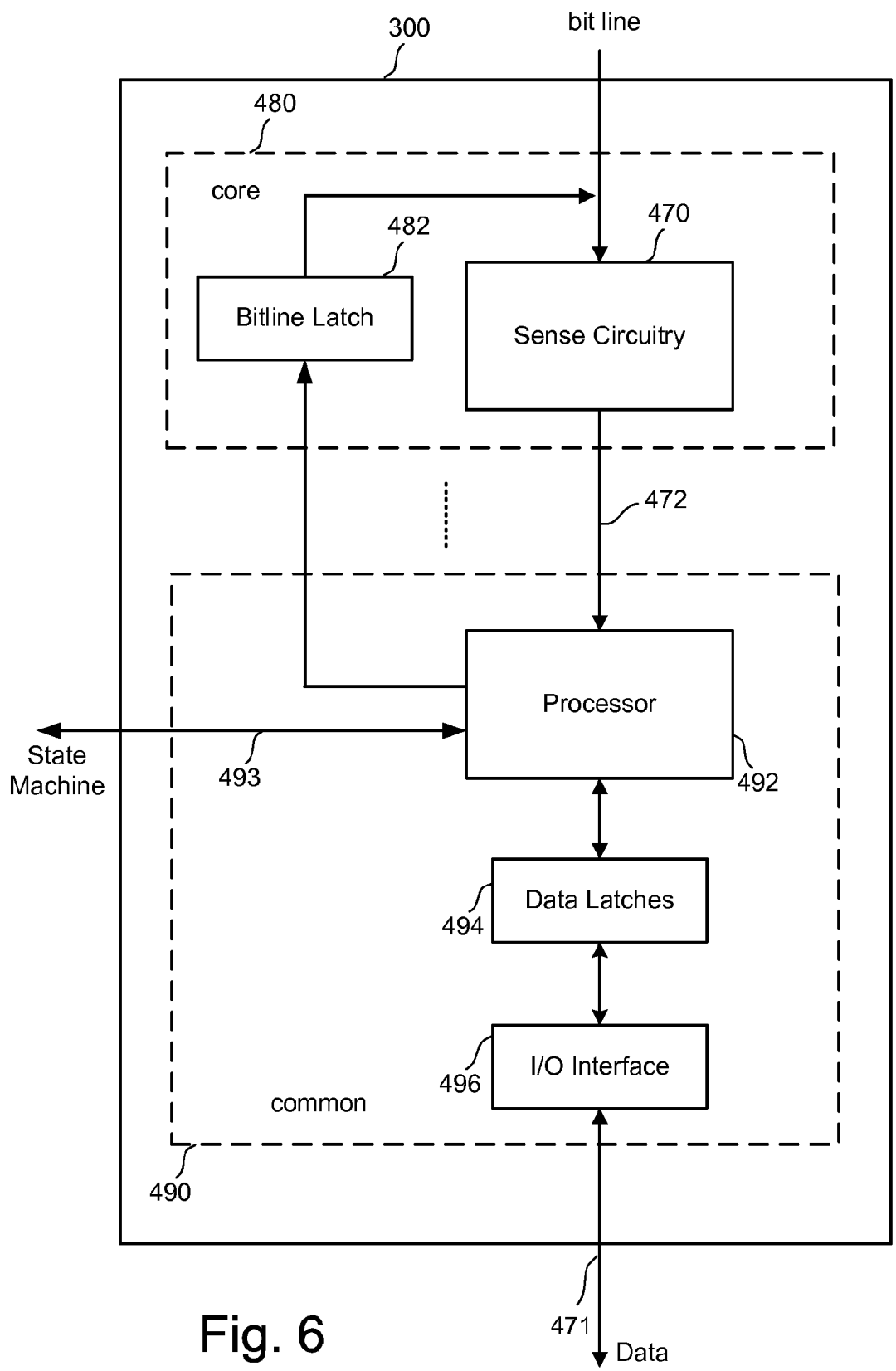
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is herby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7:
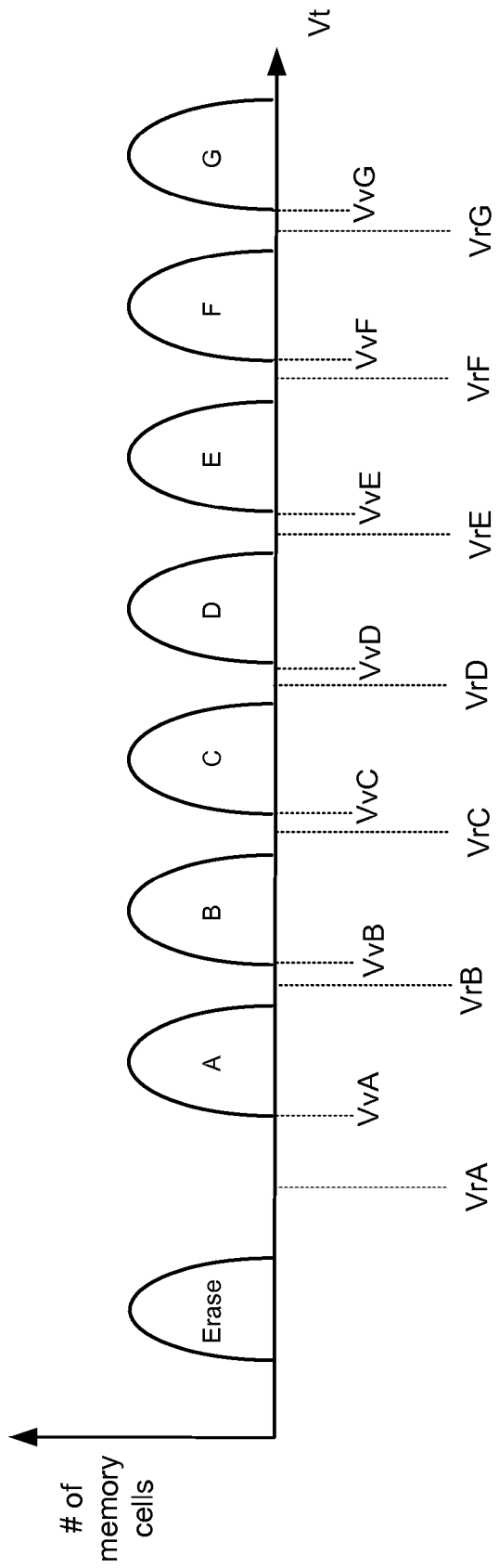
FIG. 7 depicts example threshold voltage distributions for states of memory cells in which there are eight states.

At the end of a successful programming process (with verification), the threshold voltages of the memory cells should be within one or more distributions of threshold voltages for programmed memory cells or within a distribution of threshold voltages for erased memory cells, as appropriate. FIG. 7 depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7 shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7 shows VvA for state A and VvB for state B, etc. When programming memory cells to a given state, the system will test whether those memory cells have a threshold voltage greater than or equal to the verify reference voltage.

Embodiments disclosed herein include methods and devices for applying a kicking voltage to a word line during memory cell sensing operations, such as read or program verify. As one example, when applying verify reference voltages such as VvA ... VvG, a kicking voltage is used. As one example, when applying read reference voltages such as VrA ... VrG, a kicking voltage is used. The kicking voltage may help the voltage on the selected word line to reach the target reference voltage quickly. Therefore, sensing time during read or program verify may be reduced.

Figure 8:
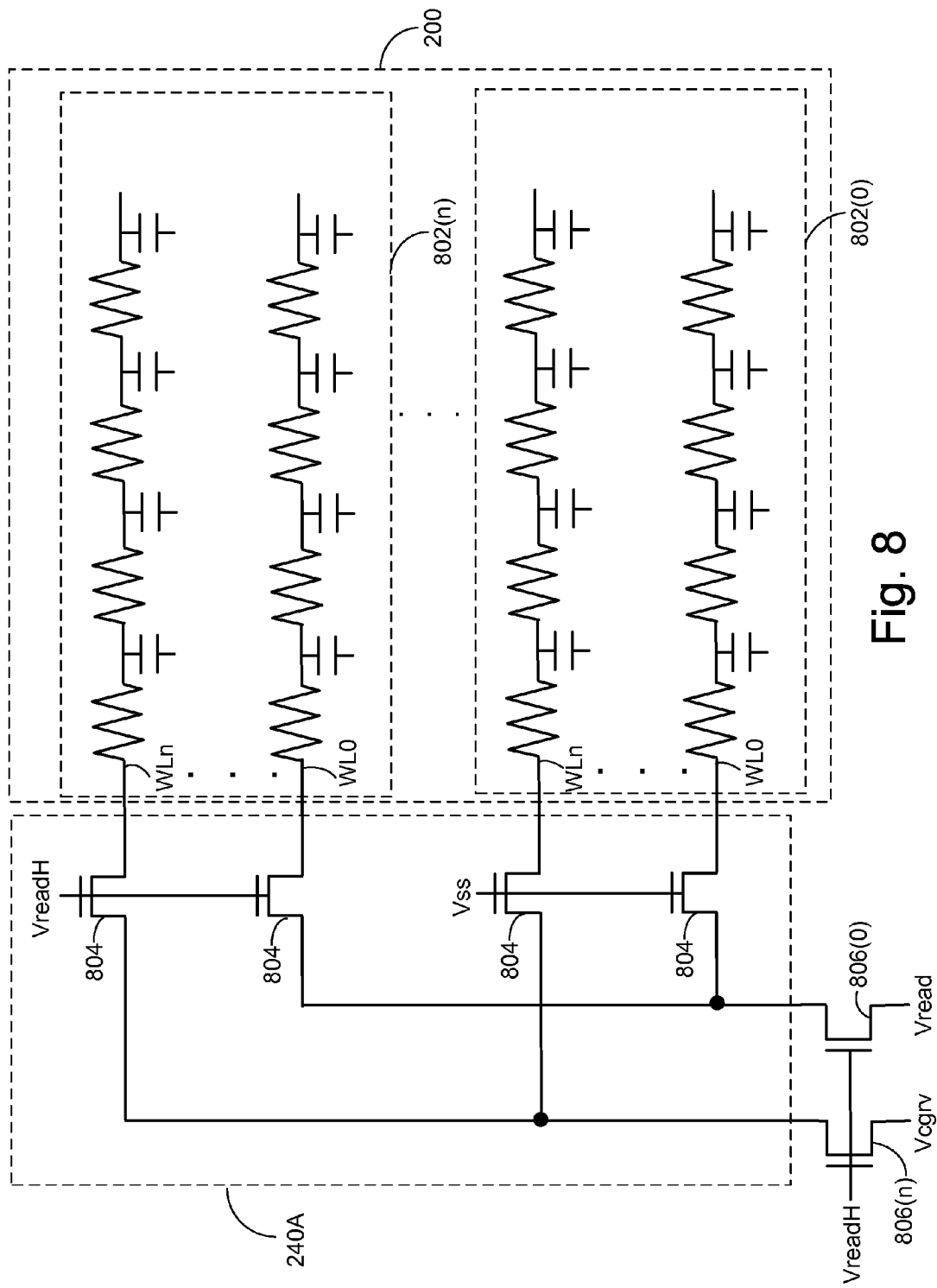
FIG. 8 depicts a schematic diagram of a portion of one embodiment of a memory array and associated decoders.

FIG. 8 depicts a schematic diagram of a portion of one embodiment of a memory array 200 and associated row decoders 240A. FIG. 8 provides more details of one embodiment of the memory array 200 and associated row decoders 240A of FIG. 4. The memory array has blocks 802(0)-802(n). Two blocks are depicted in FIG. 8, although there typically may be many more blocks 802. The word lines (WL0 ... WLn) in a block 802 are modeled as having some resistance and some capacitance. The row decoders 240A include a block select transistor connected 804 to each word line. The voltage VreadH is applied to each block select transistor 804 in block 802(n) to select that block 802(n). The voltage Vss is applied to each block select transistor 804 in other blocks (e.g., block 802(0)), such that that other blocks are un-selected. Typically, there is one selected block and many unselected blocks. There may be one word line voltage transistor 806(0)-806(n) coupled to each word line. For example, transistor 806(0) is coupled to WL0 of each block 802 through one of the word line select transistors 804. Likewise, transistor 806(n) is coupled to WLn of each block 802 through one of the word line select transistors 804. Note that a given word line voltage transistor 806 may be shared by different blocks. For example, if there are 64 word lines per block, there may be 64 word line voltage transistors 806.

A reference voltage (Vcgrv) is applied to word line voltage transistor 806(n) in order to apply Vcgrv to the selected word line (WLn) of the selected block 802(n). A read pass voltage (Vread) is applied to word line voltage transistor 806(0) in order to apply Vread to the un-selected word line (WL0) of the selected block 802(n). The voltage Vread may also be applied to other word line voltage transistors (not depicted in FIG. 8) in order to apply Vread to other un-selected word lines of the selected block 802(n). Because Vss is applied to the block select transistors 804 in the non-selected blocks, the voltages Vcgrv and Vread do not pass to the word lines in the un-selected blocks. Note that other configurations could be used to provide the voltages to the word lines.

Because there is some resistance and some capacitance associated with the word lines (both selected and un-selected), the voltages that are applied to the word lines take some time to propagate to the far end of the word lines. In other words, there is an RC time constant associated with a word line. Note that a word line may have many memory cells associated with it. For example, there may be thousands, tens of thousands or even more memory cells associated with a single word line. In some cases, bit lines of memory cells along the entire word line may be sensed during a sensing operation. For example, all memory cells on a word line might be sensed together, or every other memory cell might be sensed together. Even if fewer memory cells are being sensed, the selected word line voltage should be at its target reference voltage level before sensing the selected memory cell.

Note that in some embodiments, the resistance of the control lines outside of the memory array 200 may be lower than the resistance of the word lines. Also, the control lines may, in some cases, be spaced further apart than word lines in the memory array 200 are spaced. Therefore, capacitive coupling between control lines outside the memory array 200 may be less than for word lines. Due to this lower resistance and/or the lower capacitive coupling, the RC time constant for the control lines may be lower than that of the word lines. Thus, the signal propagation delay along the control lines may be less of a problem than the delay along word lines.

Figure 9A:
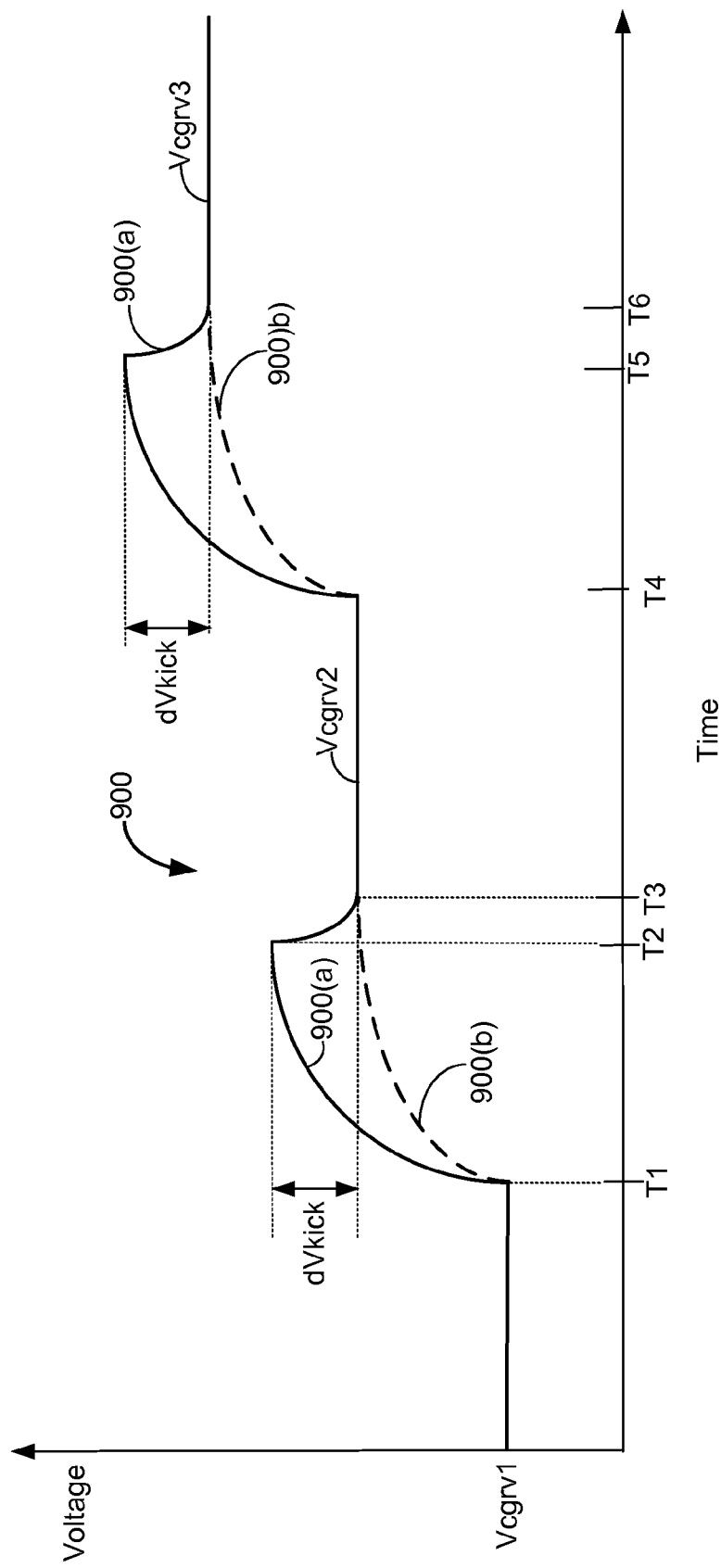
FIG. 9A is an example of voltages on a selected word line during one embodiment of a read or verify operation in which the kicking voltage is greater than a target voltage.

FIG. 9A is an example voltage waveform 900, depicting voltages on the selected word line during one embodiment of a read or verify operation. The waveform 900 depicts the voltage applied to one end of the selected word line (solid portion) and the voltage at the far end of the selected word line (dashed portion) when it is significantly different from the near end. For a portion of the time (e.g., prior to T1; between T3 and T4; and after T6), the voltage at each end of the word line is about the same). However, for some time periods (e.g., between T1 and T3, as well as between T4 and T6), the voltage at the far end is different from the near end. The difference in voltage may be due, at least in part, to signal propagation delay. The near end refers to the end of the word line near the block select transistors 804. In other words, the near end refers to the end of the selected word line at which the reference voltage is applied.

In this example, the waveform 900 has plateaus at Vcgrv1, Vcgrv2, and Vcgrv3, which may be three reference voltages. A kicking voltage may be used during the transition between Vcgrv1 and Vcgrv2. Likewise, kicking voltage may be used during the transition between Vcgrv2 and Vcgrv3. The kicking voltage may help the voltage at the far end of the word line reach the target reference voltage more quickly. The kicking voltage may be either higher or lower than the target reference voltage. In general, if the target reference voltage is greater than the present word line voltage, then the kicking voltage may be greater than the target reference voltage. On the other hand, if the target reference voltage is less than the present word line voltage, then the kicking voltage may be less than the target reference voltage. In the example of FIG. 9A, the kicking voltage is greater than the target reference voltage. For example, the kicking voltage is dVkick greater than the target reference voltage (e.g., Vcgrv2). Likewise, the kicking voltage used in the transition between Vcgrv2 and Vcgrv3 is greater than the target reference voltage (Vcgrv3). Note that it is not required that the kicking voltage have the same magnitude during each transition.

As represented by the solid line 900(a), the voltage that is applied to the near end of the selected word line ramps up between time T1 until time T2, in this example. At time T2, the voltage that is applied to the near end of the selected word line is equal to the final target voltage (Vcgrv2) plus a kicking voltage "dVkick". Then, the voltage ramps down between T2 and T3. Thus, the waveform 900(a) for the near end of the word line goes from Vcgrv1 at time T1, to a voltage that is higher than Vcgrv2 at time T2. Then, the waveform 900(a) goes down to Vcgrv2 by time T3. In one embodiment, selected memory cells are read between time T3 and T4. A kicking voltage is also applied between the transition between Vcgrv2 and Vcgrv3.

Note that the voltage at the far end of the word line (dashed line, 900b) does not match the voltage at the near end of the word line (solid line between T1 and T2, 900a) between times T1 and T3. However, the voltage 900b at the far end of the word line ramps up from Vcgrv1 at time T1 to Vcgrv2 at time T3. The voltage 900a that is applied to the near end of the word line helps the voltage at the far end 900b to reach Vcgrv2 faster than if the kicking voltage were not applied. Therefore, the worst case time for the selected word line to transition from Vcgrv1 and Vcgrv2 may be reduced. Similar reasoning applies to transitions between other reference voltages (such as the transition from Vcgrv2 and Vcgrv3). As noted above, the word line may have memory cells all along it. Therefore, the worst case delay may be reduced by applying the kicking voltage to the selected word line.

Figure 9B:
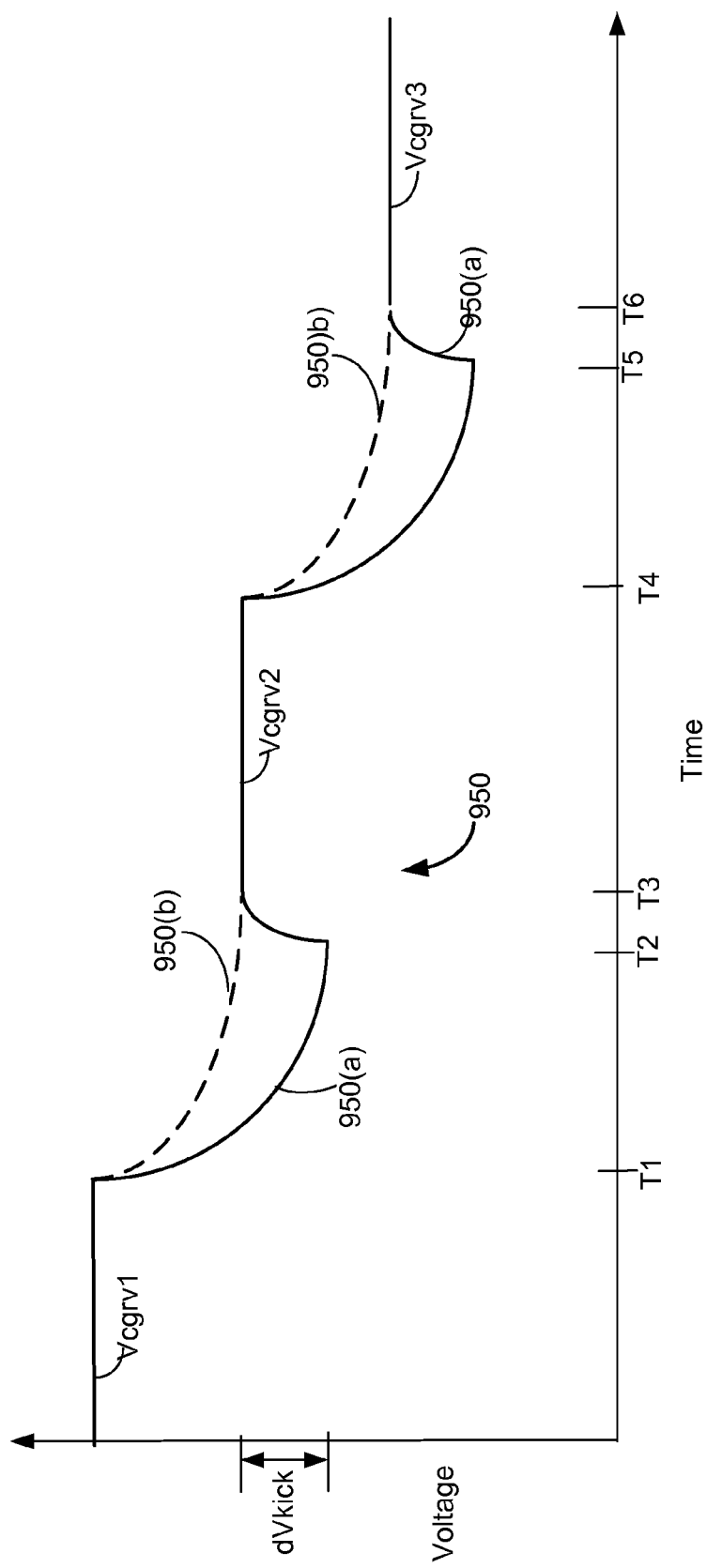
FIG. 9B is an example voltage waveform, depicting voltages on a selected word line during one embodiment of a read or verify operation in which the kicking voltage is less than a target voltage.

Note that FIG. 9A provides an example in which the target reference voltage is higher than the previous reference voltage. In some cases, the target reference voltage may be lower than the previous reference voltage. In this case, the kicking voltage may be less than the target reference voltage. FIG. 9B depicts one embodiment in which the kicking voltage is less than the target reference voltage. FIG. 9B shows one embodiment of a waveform 950 of voltages on a selected word line during a sensing operation. The waveform 950 depicts the voltage applied to one end of the selected word line (solid portion) and the voltage at the far end of the selected word line (dashed portion) when it is significantly different from the near end.

In this example, the waveform 950 has plateaus at Vcgrv1, Vcgrv2, and Vcgrv3, which may be three reference voltages. A kicking voltage may be used during the transition between Vcgrv1 and Vcgrv2. The kicking voltage may help the voltage at the far end of the word line reach the target reference voltage more quickly. In the example of FIG. 9B, a kicking voltage is applied between times T1 and T3. Likewise, a kicking voltage is used during the transition between Vcgrv2 and Vcgrv3 (between times T4 and T6). Note that the voltage ramps down between time T1 until time T2, in this example. At time T2, the voltage that is applied to the near end of the selected word line is equal to the final target reference voltage (Vcgrv2) minus a kicking voltage dVkick. Then, the voltage ramps up between T2 and T3 to reach the target reference voltage (Vcgrv2). Thus, the waveform 950(a) for the near end of the word line goes from Vcgrv1 at time T1, to a voltage that is lower than Vcgrv2 at time T2. Then, the waveform 950(a) goes up to Vcgrv2 by time T3. In one embodiment, selected memory cells are read between time T3 and T4. Similar events with respect to the kicking voltage happen between the transition between Vcgrv2 and Vcgrv3.

Note that for each of FIGS. 9A and 9B, there may be additional transitions between reference voltages. For example, referring back to FIG. 7, if there are eight states, then sensing might take place at seven levels (VrA . . . VrG) during a read operation. Thus, there might be six transitions. Also, it is not required that the transitions are always in the same direction. For example, a read sequence might be VrD, VrB, VrE, and possibly then other levels. Note that it is not required that sensing take place at every level. In other words, it is not required that all levels VrA through VrG be used.

Figure 10:
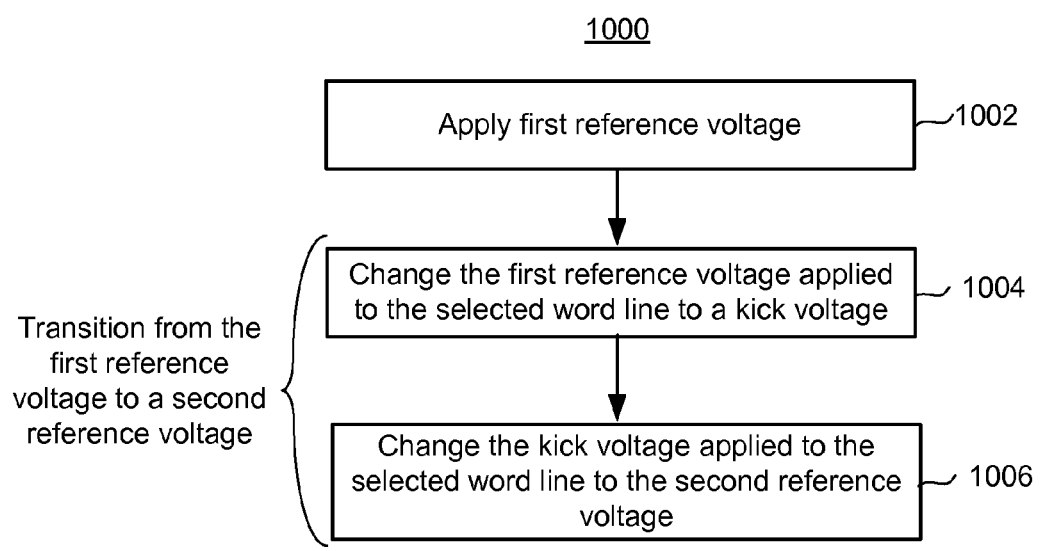
FIG. 10 is a flowchart of one embodiment of a process of sensing memory cells by applying a kicking voltage to a selected word line.

FIG. 10 is a flowchart of one embodiment of a process 1000 of sensing memory cells by applying a kicking voltage to a selected word line. Process 1000 describes applying voltages to a selected word line during a sensing operation such as read or program verify. Process 1000 describes applying a voltage to one end of a selected word line, such as the end near the block select transistors (FIG. 8, 804). Note that the voltage at the far end of the selected word line may be different from the applied voltage, as noted in the discussion of FIGS. 9A and 9B. FIG. 10 will be discussed with respect to the example waveforms 900, 950 of FIGS. 9A and 9B; however, process 1000 is not limited to those waveforms.

In step 1002, a first reference voltage is applied to a selected word line. For example, referring to FIG. 9A, the reference voltage Vcgrv1 may be applied to the near end of the selected word line. As another example, referring to FIG. 9B, the reference voltage Vcgrv1 may be applied to the near end of the selected word line. Referring to FIG. 7, this might correspond to performing a read at one of VrA through VrG if a read operation is being performed. If a verify operation is being performed, one of the levels VvA through VvG might be used.

In step 1004, the first reference voltage applied to the selected word line is changed to a kicking voltage. For example, referring to FIG. 9A, the voltage applied to the near end of the selected word line is changed from Vcgrv1 at time T1 to the voltage Vcgrv2+dVkick. It may take some time for the voltage to ramp up from Vcgrv1 to Vcgrv2+dVkick. Thus, by changing the voltage applied to the selected word line does not mean that an instantaneous change is required. As another example, referring to FIG. 9B, the voltage applied to the near end of the selected word line is changed from Vcgrv1 at time T1 to the voltage Vcgrv2−dVkick.

In step 1006, the kicking voltage being applied to the selected word line is changed to a second reference voltage. For example, referring to FIG. 9A, the voltage applied to the near end of the selected word line is changed from Vcgrv2+dVkick at time T2 to the voltage Vcgrv2 at time T3. It may take some time for the voltage to ramp down from Vcgrv2+dVkick to Vcgrv2. Thus, by changing the kicking voltage applied the second reference voltage does not mean that an instantaneous change is required. As another example, referring to FIG. 9B, the voltage applied to the near end of the selected word line is changed from Vcgrv2−dVkick at time T2 to the voltage Vcgrv2 at time T3.

Together steps 1004 and 1006 may be considered to be transitioning from the first reference voltage to the second reference voltage. Referring again to FIG. 9A, the voltage at the far end of the selected word line may transition from the first reference voltage to the second reference voltage between times T1 and T3. However, the voltage at the far end does not necessarily go above the second reference voltage. In some cases, there may be some overshoot of the voltage at the far end of the selected word line. In some embodiments, the shape of the voltage waveform that is applied to the near end of the selected word line (e.g., the kicking voltage) is designed to prevent or reduce the amount by which the voltage at the far end of the selected word line exceeds (overshoots) the second reference voltages.

Figure 11:
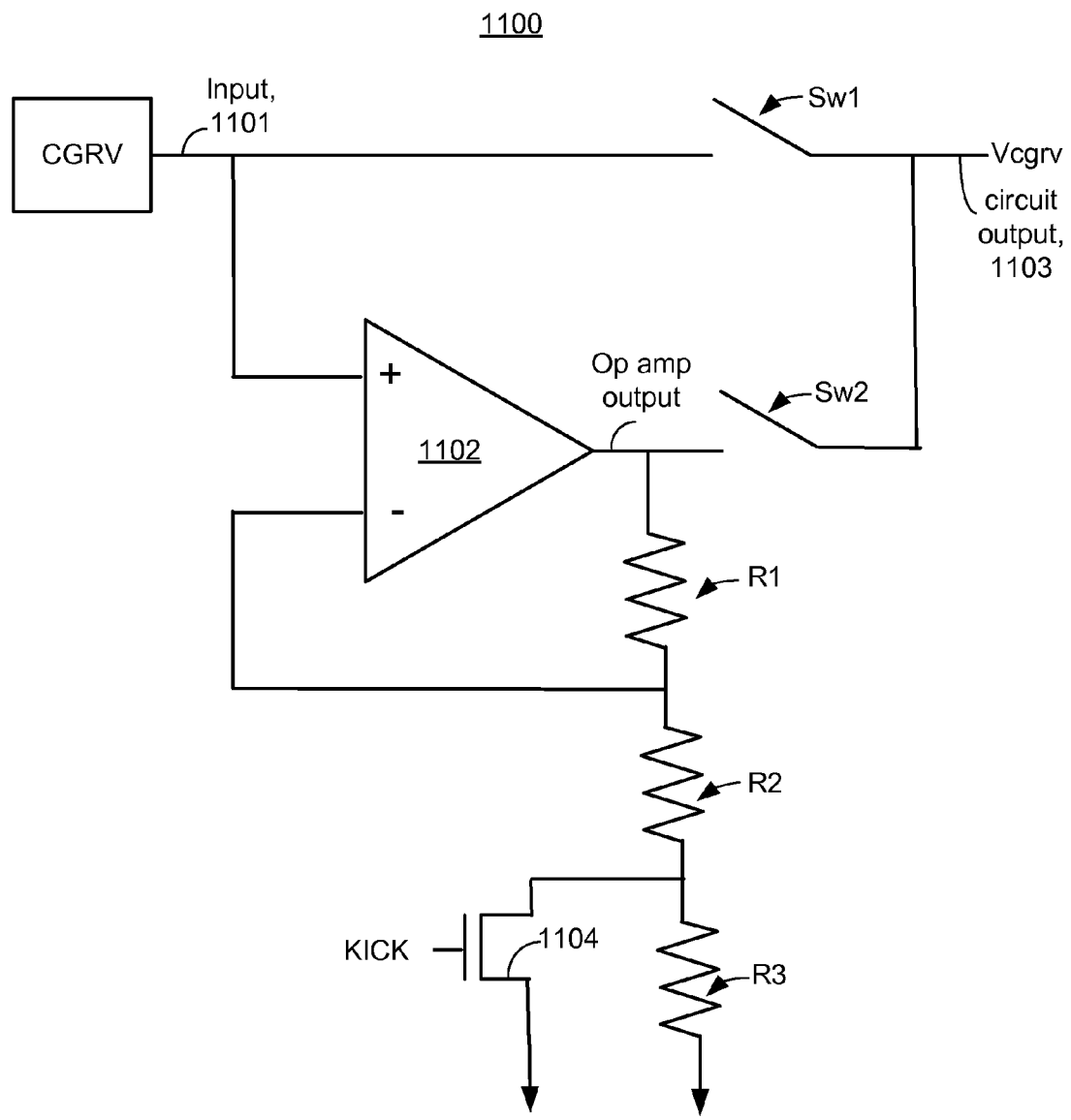
FIG. 11 is a diagram of one embodiment of a circuit that provides a word line voltage including a kicking voltage.

FIG. 11 is a diagram of one embodiment of a circuit 1100 that provides a word line voltage including a kicking voltage. The circuit 1100 may be used to provide a reference voltage during a program verify or read operation. The circuit 1100 may be used to produce an output voltage such as the solid portion of the example waveform 900 depicted in FIG. 9A. The circuit 1100 inputs a voltage (CGRV) at input 1101 and outputs a voltage Vcgrv at output 1103. Output voltage Vcgrv may be applied to the near end of a word line. For example, it may be applied to a selected word line during a read or program verify operation. Thus, as one example, the output voltage Vcgrv may be similar to the solid portion of the waveform 900 applied of FIG. 9A. Referring to FIG. 8, the circuit 1100 may provide the voltage Vcgrv. In one embodiment, circuit 1100 resides in control circuitry 220 of FIG. 4.

In general, the circuit 1100 may work as follows. The input signal CGRV is applied to the non-inverting input of the operational amplifier (op amp) 1102 and is also provided to the circuit output 1103 via switch 1 (Sw1). When switch 1 is closed, switch 2 (Sw2) may be open. Likewise, when switch 2 is closed, switch 1 may be open. Therefore, the output 1103 may either be coupled to the input 1101 or to the output of the operational amplifier 1102. The signal KICK is applied to the transistor 1104 to control whether resistor R3 is coupled between resistor R2 and ground, or whether resistor R2 is coupled to ground without R3. This controls the output operational amplifier 1102. When KICK is active (such that resistor R3 is not between R2 and ground) the output of the op amp 1102 is driven to a kicking voltage. In some embodiments, resistor R3 is very large relative to the other resistors R1, R2, such that when R3 is between R2 and ground, the output of the op amp 1102 is driven to very close to the input signal CGRV. Further details of are discussed below.

Figure 12:
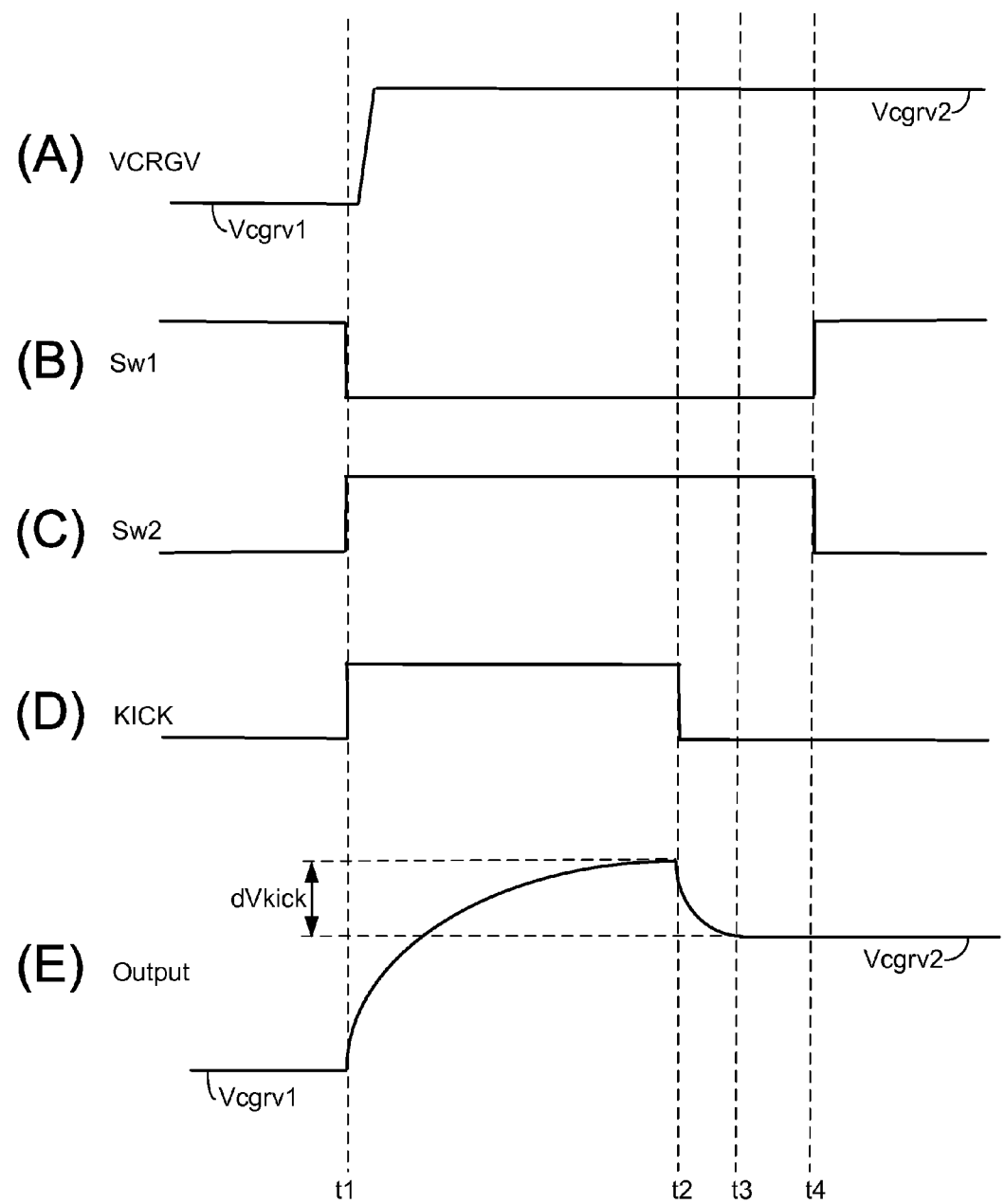
FIGS. 12A-12E are an example set of waveforms for the circuit of FIG. 11.

FIGS. 12A-12E are an example set of waveforms for the circuit 1100 of FIG. 11. FIG. 12A shows the input signal of the circuit 1100. FIG. 12B shows whether switch 1 is open (low) or closed (high). FIG. 12C shows whether switch 2 is open (low) or closed (high). FIG. 12D shows the KICK signal. FIG. 12E shows the output of the circuit 1100. The time periods in FIGS. 12A-12E do not necessarily correspond to those in FIG. 9A.

In general, the circuit input signal (FIG. 12A) starts at a first reference voltage (Vcgrv1) and transitions to a second reference voltage (Vcgrv2). The first and second reference voltages may correspond to those of FIG. 9A, as one example. Prior to time t1, the input voltage is at Vcgv1 (e.g., a first reference voltage). Also, switch 1 is closed and switch 2 is open. Therefore, the circuit's input voltage is coupled to the circuit output 1103. Prior to time t1, KICK is low (not active). Thus, transistor 1104 may be off such that resistor R3 is coupled between resistor R2 and ground. The circuit output 1103 is therefore Vcgrv1 prior to time t1, as depicted in FIG. 12E.

At time t1, switch 1 opens and switch 2 closes. Therefore, the op amp output is coupled to the circuit output 1103. At this time, KICK goes high (active). Thus, KICK turns on transistor 1104 such that resistor R2 is coupled to ground (without R3 between R2 and ground). This results in the op amp output being driven towards the kicking voltage. Since the op amp output is coupled to the circuit output 1103 at this time, this results in the circuit output ramping towards the kicking voltage, as depicted in FIG. 12E between times t1 and t2. Note that the circuit input voltage may change from one reference voltage (Vcgrv1) to another reference voltage (Vcgrv2) between time t1 and t2.

At time t2, the KICK signal goes low, which turns off transistor 1104. With transistor 1104 off, resistor R3 is coupled between resistor R2 and ground. This results in the op amp output being driven towards the circuit input voltage (which is Vcgrv2 at this time). Since switch 2 is still closed at this time, the op amp output is still coupled to the overall circuit output 1103. By time t3, the op amp output has dropped to Vcgrv2. Therefore, the circuit output 1103 ramps down to Vcgrv2 between t2 and t3, as depicted in FIG. 12E.

At time t4, switch 1 closes and switch 2 opens. Therefore, the circuit input signal is coupled to the overall circuit output 1103. Since the circuit input is Vcgrv2 at this time, the circuit output signal remains are Vcgrv2.

Further details of operation of circuit 1100 are now described. The op amp output for different time periods may be given by equations 1 and 2:

Op amp output=input*(1+$R1/R2$), when KICK is high  Eq. 1:

Op amp output=input*(1+$R1/(R2+R3)$), when KICK is low  Eq. 2:

The input refers to the circuit input 1101, which is provided to the non-inverting input of the op amp 1102. As noted, KICK may be high in order to ramp the output of the op amp 1102 to the kicking voltage (e.g., between t1 and t2 in FIG. 12).

Between t1 and t2, the output of the op amp 1102 is driven to a voltage that is (1+$R1/R2$) greater than the circuit input 1101, as noted by Equation 1. During the initial portion of this interval, the circuit input 1101 may be Vcgrv1. Thus, the op amp output is initially driven towards Vcgrv1*(1+R1/R2). At some point, during the interval between t1 and t2, the signal to circuit input 1101 may change from Vcgrv1 to Vcgrv2. This means that the op amp output is driven to Vcgrv2*(1+R1/R2) after the change. In this example, Vcgrv2 is greater than Vcgrv1, so the op amp output continues to increase. The values of R1 and R2 may be selected such that the op amp output reaches Vcgrv2+dVkick.

Between t2 and t3, KICK is off (see FIG. 12D). Therefore, the output of the op amp 1102 is driven to a voltage that is (1+R1/(R2+R3) greater than the circuit input 1101. The value of R3 may be selected such that the op amp output is driven to a value that is very close to its non-inverting input (i.e., the overall circuit input). For example, R3 may have a very large resistance relative to R1. Since the circuit input 1101 is at Vcgrv2 at this time, the op amp output is driven down to about Vcgrv2 by time t3. At time t4, switch 1 and switch 2 may change to couple the circuit input 1101 to the circuit output 1103. Therefore, the circuit output 1103 remains at Vcgrv2.

Figure 13:
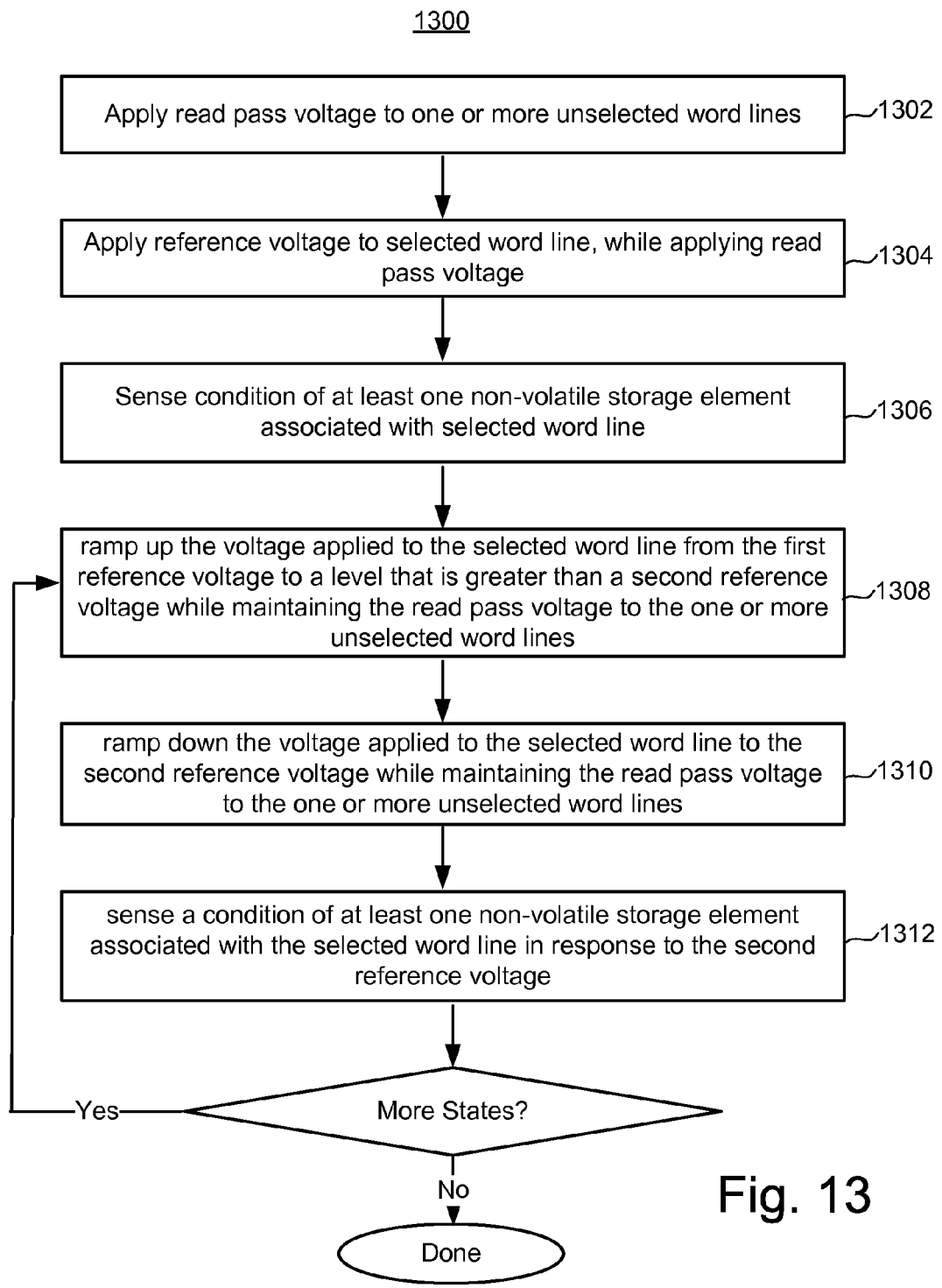
FIG. 13 is a flowchart of one embodiment of a process of sensing non-volatile storage elements, while using a kicking voltage.
Figure 14:
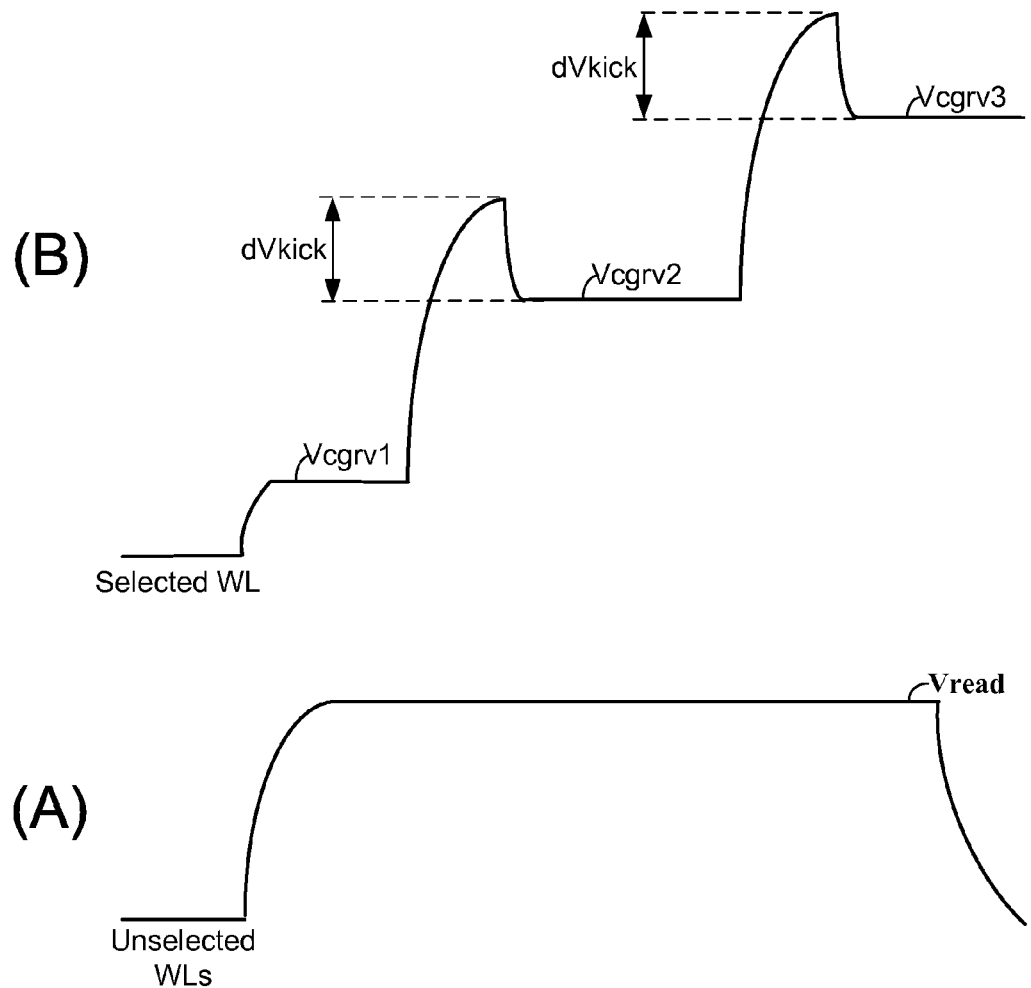
FIGS. 14A and 14B are example voltages applied to a selected word line and unselected word lines during the process of FIG. 13.

FIG. 13 is a flowchart of one embodiment of a process 1300 of sensing non-volatile storage elements, while applying a kicking voltage to a selected word line. Process 1300 may be used during a read or program verify operation. The circuit 1100 of FIG. 11 may be used to provide a voltage for a selected word line during process 1300. However, a different circuit might be used. FIGS. 14A and 14B are example voltages applied to a selected word line and unselected word lines during the process 1300 of FIG. 13.

In step 1302, a read pass voltage (e.g., Vread) is applied to one or more unselected word lines. A read pass voltage may be a voltage that is expected to be greater than the threshold voltage of all memory cells, such that any unselected memory cell will turn on and conduct a significant current. FIG. 14(A) depicts a read pass voltage waveform.

In step 1304, a reference voltage is applied to a selected word line, while maintaining the read pass voltage on the unselected word lines. For example, referring to FIG. 14B, the voltage Vcgrv1 is applied to the selected word line. Note that the waveform in FIG. 14B may be similar to the one depicted in FIG. 9A.

In step 1306, a condition of at least one non-volatile storage element associated with the selected word line is sensed. In one embodiment, a condition of the bit line associated with a selected non-volatile storage element is sensed. For example, referring to FIG. 5, a condition of one or more of bitlines BL0-BLX is sensed. Typically, many non-volatile storage elements are sensed during step 1306. Circuitry such as that depicted in FIG. 6 may be used to sense the condition of a given bit line. Each bit line may have its own sense circuit, or a sense circuit may be shared by two or more bit lines. For example, even bit lines could be sensed at one time and odd bit lines sensed at another time. Therefore, it is not required that each bit line have a dedicated sense circuit.

In one embodiment, the condition that is detected is whether the current conducted by the bit line is greater or less than a demarcation current. The demarcation current is associated with a target threshold voltage. If the current is greater than the demarcation current, then the selected non-volatile storage element is determined to have a threshold voltage below the target threshold voltage. In one embodiment, the bit line current is used to charge (or discharge) a capacitor in the sense circuit. The capacitor may be charged (or discharged) for a certain period of time, and then the voltage on the capacitor may be compared to a reference level. If the selected non-volatile storage element has a threshold voltage below the target threshold voltage it is expected to conduct a relatively strong current and therefore the bit line current should be high. Therefore, the voltage on the capacitor may be examined to determine whether the selected non-volatile storage element has a threshold voltage above/below the target threshold voltage.

In step 1308, the voltage that is applied to the selected word line is ramped up from the first reference voltage to a level that is greater than a second reference voltage, while maintaining the read pass voltage to the one or more unselected word lines. For example, referring to FIG. 14B, the voltage is ramped from Vcgrv1 to Vcgrv2+dVkick. During this time, the voltage on the unselected word lines may be maintained at Vread.

In step 1310, the voltage applied to the selected word line is ramped down to the second reference voltage while maintaining the read pass voltage to the one or more unselected word lines. For example, the voltage is ramped down from Vcgrv2+dVkick to Vcgrv2. During this time, the voltage on the unselected word lines may be maintained at Vread.

In step 1312, a condition of at least one non-volatile storage element associated with the selected word line is sensed in response to the second reference voltage. During step 1312, the voltage on the selected word line may be maintained at Vcgrv2 and the voltages on the unselected word lines may be maintained at Vread. In one embodiment, a condition of one or more bit lines is sensed during step 1312.

If there are more states to read (or verify), then the process may return to step 1308 to ramp up the voltage applied to the selected word line. For example, referring to FIG. 14B, the voltage may be ramped up from Vcgrv2 to Vcgrv3+dVkick. Then, step 1310 may be repeated, wherein the voltage is ramped down to Vcgrv3 (target value). Then, step 1312 may be repeated to sense a condition of at least one selected non-volatile storage element. The process may continue until all states are sensed. Note that one variation of process 1300 is to modify the process so that it is suitable for the waveform of FIG. 9B.

Figure 15:
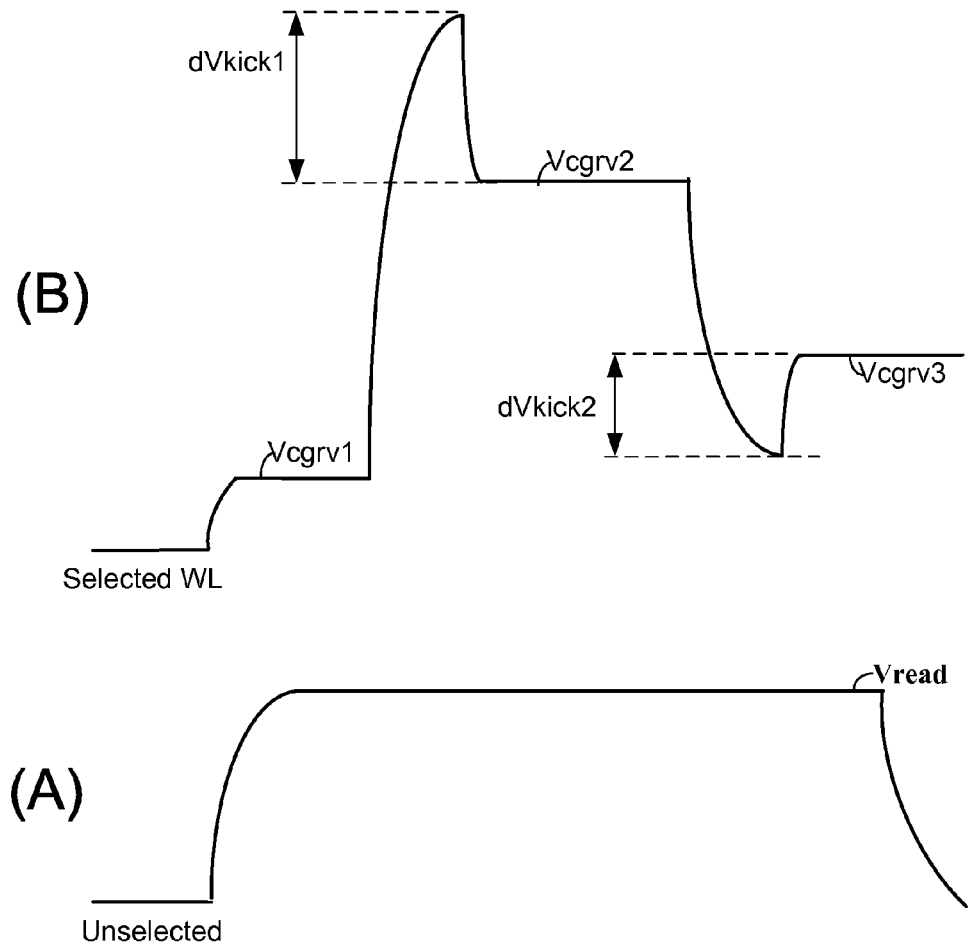
FIGS. 15A and 15B are example voltages applied to a selected word line and unselected word lines during a sense operation.

FIGS. 15A and 15B depict waveforms for one embodiment of voltages applied to a selected word line and unselected word lines during a sensing operation, such as read or program verify. In this case, the second reference voltage (Vcgrv2) is greater than the first (Vcgrv1). However, the third reference voltage (Vcgrv3) is less than the second. In this case, the first kicking voltage (dVkick1) is greater than the target voltage (Vcgrv2). However, the second kicking voltage (dVkick2) is less than the target voltage (Vcgrv3).

Also note that the absolute magnitude of the first kicking voltage (dVkick1) may be greater than the absolute magnitude of the second kicking voltage (dVkick2). In general, it is not required that the kicking voltage that is used for different transitions have the same absolute magnitude. In other words, the amount by which the kicking voltage overshoots (or undershoots) the target voltage may be different for different transitions.

Figure 16:
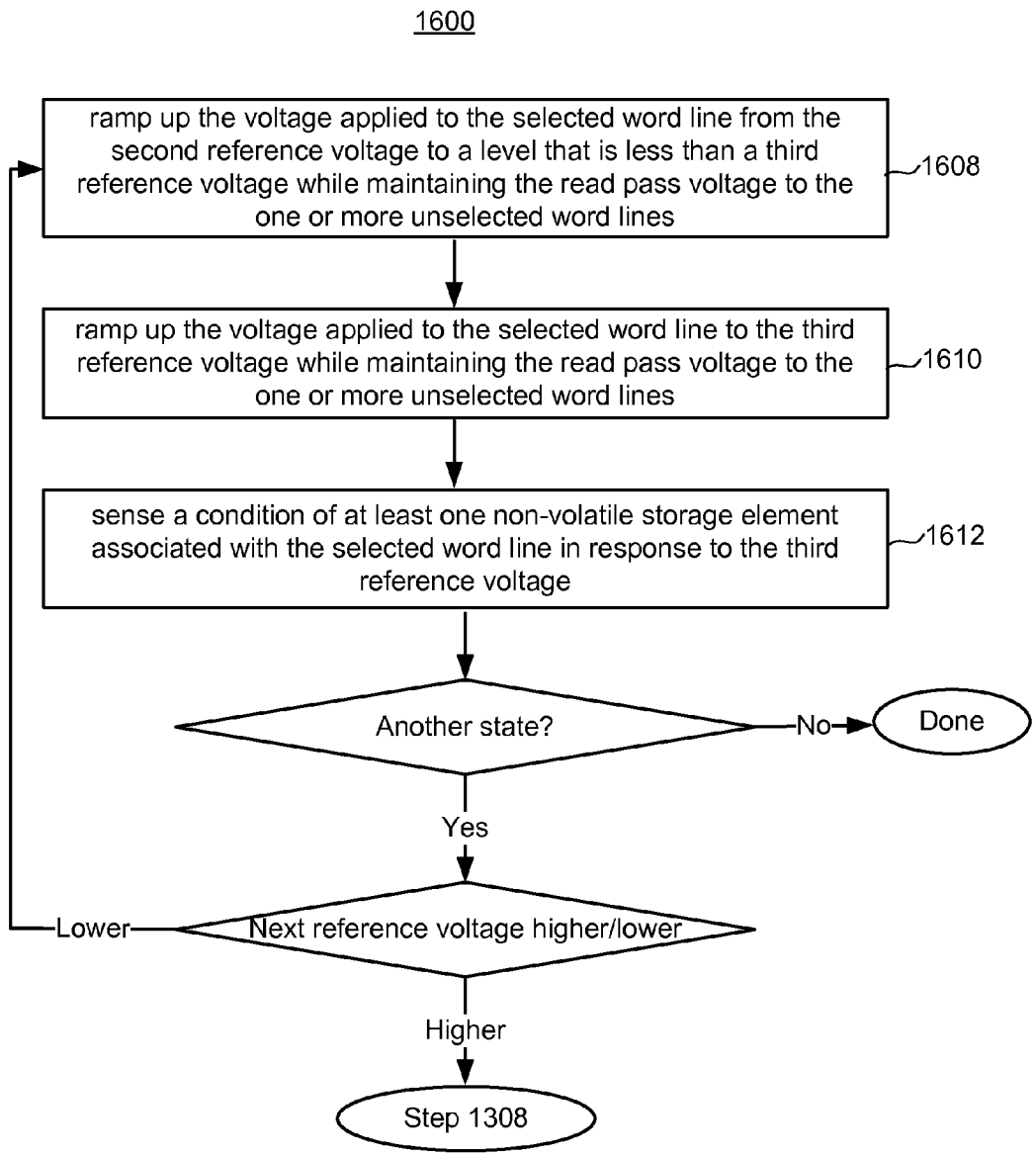
FIG. 16 is a flowchart of one embodiment of a process of sensing non-volatile storage elements, while using a kicking voltage that is less than a target reference voltage.

FIG. 16 is a flowchart of one embodiment of a process 1600 of sensing in which the target reference voltage is less than the present reference voltage. Process 1600 may be used to implement the portion of FIG. 15 for the transition between Vcgrv2 and Vcgrv3. Prior to process 1600, a process such as process 1300 may be used to first establish Vcgrv1 and then transition to Vcgrv2. Thus, for the sake of illustration, process 1600 begins with Vcgrv2 being applied to the selected word line. As one example, Vcgrv1 might correspond to VrA and Vcgrv2 might correspond to VrD.

In step 1608, the voltage that is applied to the selected word line is ramped down from the second reference voltage (e.g., Vcgrv2) to a level that is less than a third reference voltage (e.g., Vcgrv3) while maintaining the read pass voltage to the one or more unselected word lines. For example, referring to FIG. 15B, the voltage is ramped from Vcgrv2 to Vcgrv3–dVkick. During this time, the voltage on the unselected word lines may be maintained at Vread.

In step 1610, the voltage applied to the selected word line is ramped up to the third reference voltage while maintaining the read pass voltage to the one or more unselected word lines. For example, the voltage is ramped up from Vcgrv3–dVkick to Vcgrv3. During this time, the voltage on the unselected word lines may be maintained at Vread.

In step 1612, a condition of at least one non-volatile storage element associated with the selected word line is sensed in response to the second reference voltage. During step 1612, the voltage on the selected word line may be maintained at Vcgrv3 and the voltages on the unselected word lines may be maintained at Vread. In one embodiment, a condition of one or more bit lines is sensed during step 1612.

If there are more states to read (or verify), then the process may return to step 1608 to ramp down the voltage applied to the selected word line, if the next reference voltage level is lower. As an alternative, the process may go to step 1308 of process 1300 to ramp up the voltage applied to the selected word line, if the next reference voltage level is higher. Note that process 1300 may be modified such that after performing step 1312, the process could jump to process 1600 if the next reference level is lower.

One embodiment includes a method for operating non-volatile storage comprising the following. A first reference voltage is applied to a selected word line. The first reference voltage is transitioned to a second reference voltage. The transitioning may include changing the first reference voltage applied to the selected word line to a kicking voltage, and changing the kicking voltage applied to the selected word line to the second reference voltage. The kicking voltage may be greater than the second reference voltage if the second reference voltage is greater than the first reference voltage. The kicking voltage may be less than the second reference voltage if the second reference voltage is less than the first reference voltage.

One embodiment includes a method for operating non-volatile storage comprising the following. A read pass voltage is applied to one or more unselected word lines. A first reference voltage is applied to a selected word line while applying the read pass voltage to the one or more unselected word lines. A condition of at least one non-volatile storage element associated with the selected word line is sensed in response to the first reference voltage. The voltage applied to the selected word line is ramped up from the first reference voltage to a level that is greater than a second reference voltage while maintaining the read pass voltage to the one or more unselected word lines. The second reference voltage is greater than the first reference voltage. The voltage applied to the selected word line is ramped down to the second reference voltage while maintaining the read pass voltage to the one or more unselected word lines. A condition of at least one non-volatile storage element associated with the selected word line is sensed in response to the second reference voltage.

One embodiment includes a circuit comprising a circuit input that inputs a reference voltage and a circuit output. The reference voltage transitions from a first level to a second level that is higher than the first level. The circuit output outputs a signal that is the first level for a first period, transitions from the first level to the second level during a second period, and is the second level during a third period. The output signal transition includes ramping to a voltage that is greater than the second level for a first portion of the second period and decreasing to the second level during a second portion of the second period.

One embodiment includes a non-volatile storage device comprising a plurality of non-volatile storage elements, a plurality of word lines associated with the plurality of non-volatile storage elements, and one or more managing circuits in communication with the one or more word lines. The one or more managing circuits apply a first reference voltage to a selected word line. The one or more managing circuits transition from applying the first reference voltage to applying a second reference voltage to the selected word line. As part of the transition from the first reference voltage to the second reference voltage the one or more managing circuits change the first reference voltage applied to the selected word line to a kicking voltage. The kicking voltage is greater than the second reference voltage if the second reference voltage is greater than the first reference voltage. The kicking voltage is less than the second reference voltage if the second reference voltage is less than the first reference voltage. The one or more managing circuits change the kicking voltage applied to the selected word line to the second reference voltage.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain the principles and practical applications, to thereby enable others skilled in the art to best utilize various embodiments and with various modifications as are suited to the particular use contemplated. It is intended that the scope be defined by the claims appended hereto.

What is claimed is:

1. A method for operating non-volatile storage, the method comprising:
    applying a first read or verify reference voltage to a selected word line;
    transitioning from the first read or verify reference voltage to a second read or verify reference voltage, the transitioning including:
        changing the first read or verify reference voltage applied to the selected word line to a kicking voltage, the kicking voltage is greater than the second read or verify reference voltage if the second read or verify reference voltage is greater than the first read or verify reference voltage, the kicking voltage is less than the second read or verify reference voltage if the second read or verify reference voltage is less than the first read or verify reference voltage; and
        changing the kicking voltage applied to the selected word line to the second read or verify reference voltage.

2. The method of claim 1, wherein the changing the first read or verify reference voltage applied to the selected word line to the kicking voltage includes increasing the voltage applied to the selected word line from the first read or verify reference voltage to the kicking voltage, the changing the kicking voltage applied to the selected word line to the second read or verify reference voltage includes decreasing the kicking voltage to the second read or verify reference voltage.

3. The method of claim 1, wherein the changing the first read or verify reference voltage applied to the selected word line to the kicking voltage includes decreasing the voltage applied to the selected word line from the first read or verify reference voltage to the kicking voltage, the changing the kicking voltage applied to the selected word line to the second read or verify reference voltage includes increasing the kicking voltage to the second read or verify reference voltage.

4. The method of claim 1, further comprising:
transitioning from the second read or verify reference voltage to a third read or verify reference voltage that is greater than the second read or verify reference voltage, the kicking voltage is a first kicking voltage, the transitioning including:
increasing the second read or verify reference voltage to a second kicking voltage that is greater than the third read or verify reference voltage; and
reducing the second kicking voltage to the third read or verify reference voltage.

5. The method of claim 1, further comprising:
sensing conditions of non-volatile storage elements associated with the selected word line in response to the first read or verify reference voltage; and
sensing conditions of non-volatile storage elements associated with the selected word line in response to the second read or verify reference voltage.

6. The method of claim 1, further comprising:
maintaining a read pass voltage on unselected word lines while transitioning from the first read or verify reference voltage to the second read or verify reference voltage.

7. A method for operating non-volatile storage, the method comprising:
applying a read pass voltage to one or more unselected word lines;
applying a first reference voltage to a selected word line while applying the read pass voltage to the one or more unselected word lines;
sensing a condition of at least one non-volatile storage element associated with the selected word line in response to the first reference voltage;
ramping up the voltage applied to the selected word line from the first reference voltage to a level that is greater than a second reference voltage while maintaining the read pass voltage to the one or more unselected word lines, the second reference voltage is greater than the first reference voltage;
ramping down the voltage applied to the selected word line to the second reference voltage while maintaining the read pass voltage to the one or more unselected word lines; and
sensing a condition of at least one non-volatile storage element associated with the selected word line in response to the second reference voltage.

8. The method of claim 7, further comprising:
ramping up the voltage applied to the selected word line from the second reference voltage to a level that is greater than a third reference voltage while maintaining the read pass voltage to the one or more unselected word lines, the third reference voltage is greater than the second reference voltage;
ramping down the voltage applied to the selected word line to the third reference voltage while maintaining the read pass voltage to the one or more unselected word lines; and
sensing a condition of at least one non-volatile storage element associated with the selected word line in response to the third reference voltage.

9. The method of claim 7, further comprising:
ramping down the voltage applied to the selected word line from the second reference voltage to a level that is less than a third reference voltage while maintaining the read pass voltage to the one or more unselected word lines, the third reference voltage is less than the second reference voltage;
ramping up the voltage applied to the selected word line to the third reference voltage while maintaining the read pass voltage to the one or more unselected word lines; and
sensing a condition of at least one non-volatile storage element associated with the selected word line in response to the third reference voltage.

10. A non-volatile storage device comprising:
a plurality of non-volatile storage elements;
a plurality of word lines associated with the plurality of non-volatile storage elements; and
one or more managing circuits in communication with the one or more word lines, the one or more managing circuits apply a first read or verify reference voltage to a selected word line; the one or more managing circuits transition from applying the first read or verify reference voltage to applying a second read or verify reference voltage to the selected word line, as part of the transition from the first read or verify reference voltage to the second read or verify reference voltage the one or more managing circuits change the first read or verify reference voltage applied to the selected word line to a kicking voltage, the kicking voltage is greater than the second read or verify reference voltage if the second read or verify reference voltage is greater than the first read or verify reference voltage, the kicking voltage is less than the second read or verify reference voltage if the second read or verify reference voltage is less than the first read or verify reference voltage, the one or more managing circuits change the kicking voltage applied to the selected word line to the second read or verify reference voltage.

11. The non-volatile storage device of claim 10, further comprising:
a voltage circuit having an input that inputs a read signal, the read signal includes the first read or verify reference voltage and the second read or verify reference voltage, the voltage circuit having a circuit output that outputs the first read or verify reference voltage for a first period, transitions from the first read or verify reference voltage to the second read or verify reference voltage during a second period, and is the second read or verify reference voltage during a third period, the circuit output transition includes ramping to a kicking voltage that is greater than the second read or verify reference voltage for a first portion of the second period and decreasing to the second read or verify reference voltage during a second portion of the second period, the one or more managing circuits apply the output of the circuit to a selected word line of the plurality of word lines when reading or verifying non-volatile storage elements associated with the selected word line.

12. The non-volatile storage device of claim 11, wherein the circuit includes an amplifier that inputs the read signal, the amplifier has an output that ramps from the read signal to a voltage that is an offset higher than the read signal during the first portion of the second period, the read signal transitions from the first read or verify reference voltage to the second read or verify reference voltage prior to the end of the first portion of the second period.

13. The non-volatile storage device of claim 12, wherein the amplifier output ramps down from the offset higher than the read signal to approximately the read signal during the second portion of the second period.

14. The non-volatile storage device of claim 13, wherein the circuit inputs a kick signal that controls the ramping of the amplifier output during the first portion of the second period.

15. The non-volatile storage device of claim 13, wherein the circuit includes at least one switch that couples the read signal to the circuit output during the first period and the third period.

16. The non-volatile storage device of claim 15, wherein the at least one switch couples the amplifier output to the circuit output during the second period.

17. The non-volatile storage device of claim 10, wherein as a part of changing the first read or verify reference voltage applied to the selected word line to the kicking voltage the one or more managing circuits increase the voltage applied to the selected word line from the first read or verify reference voltage to the kicking voltage, as a part of the changing the kicking voltage applied to the selected word line to the second read or verify reference voltage the one or more managing circuits decrease the kicking voltage to the second read or verify reference voltage.

18. The non-volatile storage device of claim 10, wherein as a part of changing the first read or verify reference voltage applied to the selected word line to the kicking voltage the one or more managing circuits decrease the voltage applied to the selected word line from the first read or verify reference voltage to the kicking voltage, as a part of the changing the kicking voltage applied to the selected word line to the second read or verify reference voltage the one or more managing circuits increase the kicking voltage to the second read or verify reference voltage.

19. The non-volatile storage device of claim 10, wherein the one or more managing circuits sense conditions of non-volatile storage elements associated with the selected word line in response to the first read or verify reference voltage, the one or more managing circuits sense conditions of non-volatile storage elements associated with the selected word line in response to the second read or verify reference voltage.

20. The non-volatile storage device of claim 10, wherein the one or more managing circuits maintain a read pass voltage on unselected word lines while the one or more managing circuits transition the voltage applied to the selected word line from the first read or verify reference voltage to the second read or verify reference voltage.

* * * * *